United States Patent
Swanbeck et al.

(10) Patent No.: US 9,362,716 B2
(45) Date of Patent: Jun. 7, 2016

(54) CRYSTAL MOUNT FOR LASER APPLICATION

(71) Applicant: IPG Photonics Corporation, Oxford, MA (US)

(72) Inventors: Daniel Swanbeck, San Jose, CA (US); Mark W. Byer, Mountain View, CA (US); Manuel Martinez, Fremont, CA (US)

(73) Assignee: IPG PHOTONICS CORPORATION, Oxford, MA (US)

( * ) Notice: Subject to any disclaimer, the term of this patent is extended or adjusted under 35 U.S.C. 154(b) by 0 days.

(21) Appl. No.: 14/491,909

(22) Filed: Sep. 19, 2014

(65) Prior Publication Data

US 2016/0087394 A1   Mar. 24, 2016

(51) Int. Cl.
*H01S 3/10* (2006.01)
*H01S 5/022* (2006.01)
(Continued)

(52) U.S. Cl.
CPC ....... *H01S 5/02264* (2013.01); *H01S 3/094003* (2013.01); *H01S 3/10007* (2013.01); *H01S 3/109* (2013.01); *H01S 5/022* (2013.01); *H01S 5/02256* (2013.01)

(58) Field of Classification Search
CPC ... H01S 3/0092; H01S 3/08059; H01S 5/022; H01S 5/02248; H01S 5/02256; H01S 5/02264; H01S 3/109; H01S 3/094003; H01S 3/10007; G02B 6/0218; G02B 6/02209; G02B 6/3879; G02B 6/3898; G02B 6/4405; G02B 6/4244; G02B 6/4236
See application file for complete search history.

(56) References Cited

U.S. PATENT DOCUMENTS 3,970,960 A * 7/1976 Mollenauer ........... H01S 3/1681
                                                     359/337
4,509,829 A * 4/1985 Peterson .................. G02F 1/11
                                                     359/286

(Continued)

FOREIGN PATENT DOCUMENTS

JP   S616015 A   1/1986

OTHER PUBLICATIONS

The Applicant ordered parts corresponding to those shown in FIG. 4A, FIG. 4B, FIG. 5B, FIG. 6, and FIG. 7 to be manufactured by a third party in Jun. 2013. Each sheet of engineering drawings for the parts sent to the third party included the following statement: "Confidential: This Document Contains Propriety Information and/or Data and is Only for the Use of IPG Photonics Corp. It is Not to be Communicated to Others Without the Expressed Written Consent of IPG Photonics Corp."
(Continued)

*Primary Examiner* — Yuanda Zhang
(74) *Attorney, Agent, or Firm* — Joshua D. Isenberg; JDI Patent

(57) ABSTRACT

An optical crystal can be mounted to a mounting block configured to receive the crystal. A base portion on the mounting block utilizes two walls forming a corner and a single biasing spring clip to secure the crystal. The spring clip applies forces in two different directions substantially orthogonal to the two walls. The spring clip is based off a symmetrical geometry which applies nearly the same force application in both directions. The spring also features rounded bend regions that contact the crystal in such a way as to reduce the presence of point loads or stress risers. The length of contact along the crystal is maximized, allowing for proper force distribution and a sufficient surface are contact for static holding capabilities.

23 Claims, 6 Drawing Sheets

(51) Int. Cl.
*H01S 3/109* (2006.01)
*H01S 3/094* (2006.01)

(56) References Cited

U.S. PATENT DOCUMENTS

| | | | |
|---|---|---|---|
| 5,737,346 A * | 4/1998 | Stenstrom | G02B 7/00 359/326 |
| 8,044,988 B2 * | 10/2011 | Peters | B41J 2/471 248/475.1 |
| 8,305,680 B2 | 11/2012 | Martinez et al. | |
| 8,422,119 B1 | 4/2013 | Keaton et al. | |
| 2004/0165625 A1 | 8/2004 | Momiuchi et al. | |
| 2006/0103906 A1 | 5/2006 | Sato et al. | |
| 2008/0056642 A1 * | 3/2008 | Byer | G02B 6/4296 385/27 |
| 2008/0247431 A1 | 10/2008 | Feklistov | |

OTHER PUBLICATIONS

International Search Report and Written Opinion for International Application No. PCT/US2015/050780, dated Dec. 29, 2015.

* cited by examiner

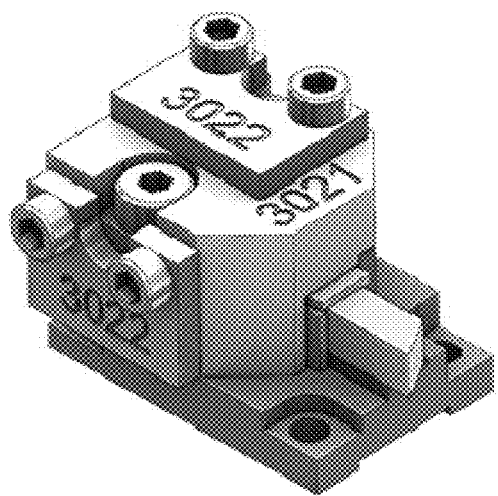
FIG. 2A - Prior Art
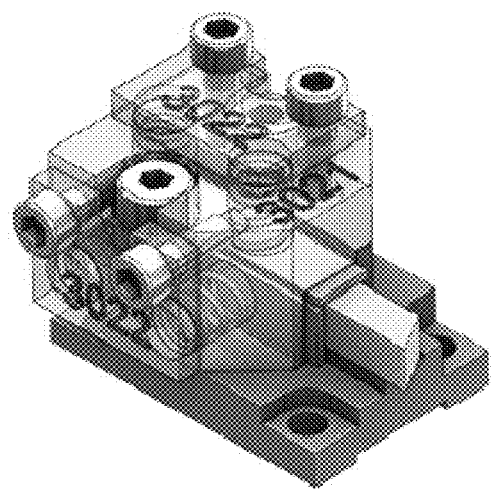
FIG. 2B - Prior Art

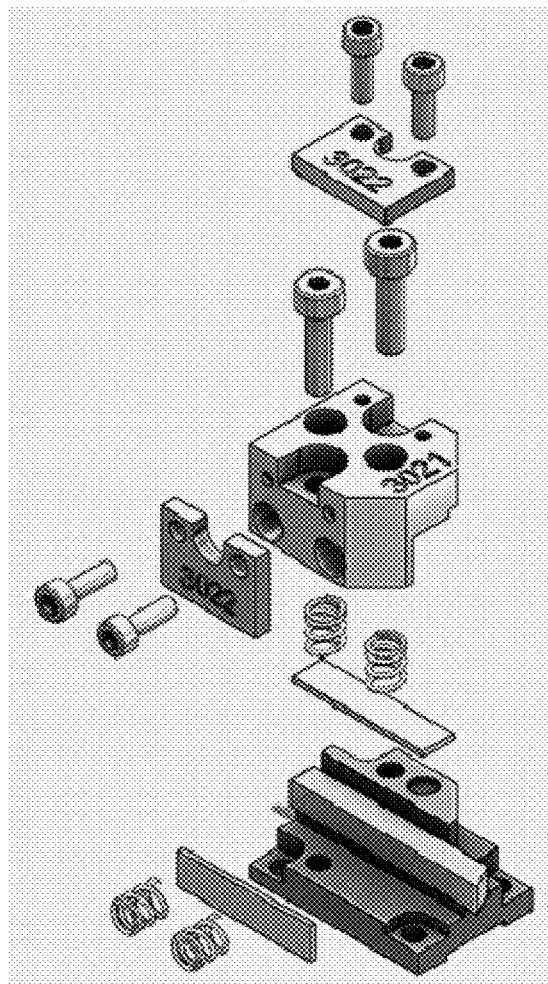
FIG. 2C - Prior Art

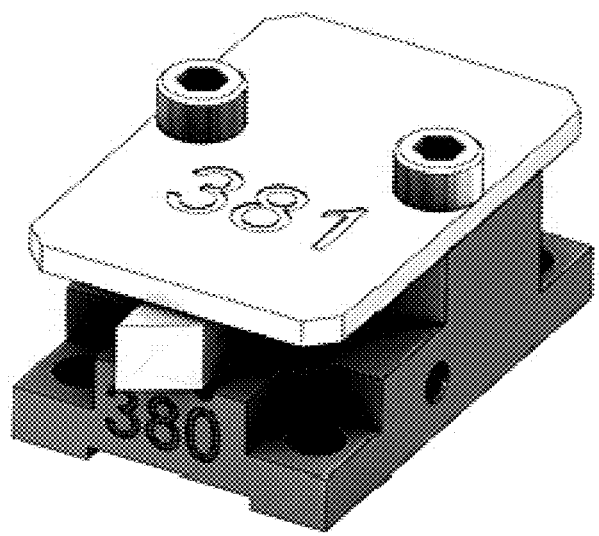
FIG. 3A – Prior Art
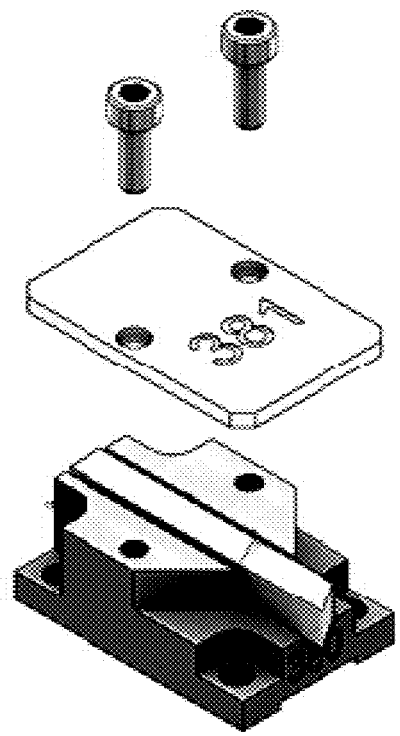
FIG. 3B – Prior Art

CRYSTAL MOUNT FOR LASER APPLICATION

FIELD OF THE INVENTION

Aspects of the present disclosure are generally related to non-linear optical systems and more specifically related to mounting of non-linear optical crystals.

BACKGROUND OF THE INVENTION

Optical systems generally require the precise and rigid alignment of lenses, prisms, mirrors, and other optical components. Proper alignment is especially important in laser systems, where misalignment of the optical components can degrade performance. In addition, frequency doubling and other nonlinear processes involving crystals often require that the crystal be precisely aligned in order to achieve the optimum conversion efficiency to meet stringent beam performance requirements.

Stable alignment is therefore especially critical for both intracavity and extracavity, nonlinear crystal resonator configurations, in which the crystal may or may not reside within the resonator.

Alignment problems are considerably aggravated when the laser system is subjected to vibrations. Temperature cycling presents problems as well, since the optical components may expand and contract with changes in temperature at different rates. To minimize alignment problems, specialized optical mounts are frequently used to secure optical components.

In a wavelength-converted laser system, laser radiation undergoes a nonlinear optical process in some nonlinear medium, such as a nonlinear optical crystal. The nonlinear optical process converts some portion of the laser radiation to a different wavelength. The phase matching of a nonlinear crystal is typically adjusted by (1) precise cuts on the crystalline axis, (2) precise mounting of the crystal, (3) controlling the temperature of the crystal. The crystal is typically mounted to a specially-designed oven and the temperature of the crystal is adjusted by adjusting the temperature of the oven. An example of a wavelength-converted laser system is disclosed in U.S. Pat. No. 8,422,119, which is incorporated herein by reference.

Examples of non-linear crystals include, but are not limited to, lithium niobate ($LiNbO_3$), lithium triborate (LBO), beta-barium borate (BBO), cesium lithium borate (CLBO), lithium tantalite, stoichiometric lithium tantalite (SLT) potassium titanyl phosphate ($KTiOPO_4$ also known as KTP), ammonium dihydrogen arsenate (ADA), ammonium dihydrogen phosphate (ADP), cesium triborate ($CsB_3O_5$ or CBO), deuterated ammonium dihydrogen arsenate (DADA), deuterated ammonium dihydrogen phosphate (DADP), deuterated arginine phosphate (DLAP), rubidium di-deuterium phosphate ($RbD_2PO_4$ or DRDP, potassium aluminum borate (KABO), potassium dihydrogen arsenate (KDA), potassium dihydrogen phosphate (KDP), deuterated potassium dihydrogen phosphate ($KD_2PO_4$ or DKDP), $L_i2B_4O_7$ (LB4), or lithium formate monohydrate (LFM) and isomorphs thereof, periodically poled materials such as periodically poled lithium niobate (PPLN), periodically poled lithium tantalite and periodically poled stoichiometric lithium tantalite (PPSLT).

Lithium Triborate $LiB_3O_5$ or LBO is an example of an interesting and useful nonlinear optical crystal. LBO is unique in many aspects, especially its wide transparency range, moderately high nonlinear coupling, high damage threshold and good chemical and mechanical properties. LBO crystal is also phase-matchable for second harmonic generation (SHG) and third harmonic generation (THG) of Nd:YAG and Nd:YLF lasers by using either type I or type II interaction. For SHG at room temperature, type I phase-matching can be reached and has maximum effective SHG coefficient in the principal XY and XZ planes in a wide wavelength range from 551 nm to about 3000 nm. LBO's transmission range is from 0.21 μm to 2.3 μm. LBO allows temperature-controllable non-critical phase-matching (NCPM) for 1.0-1.3 μm, Type I SHG, and also provides room temperature non-critical phase matching (NCPM) for Type II SHG at 0.8-1.1 μm. LBO is also a desirable nonlinear optical material because it possesses a reasonable angular acceptance bandwidth, reducing the beam quality requirements for source lasers.

SHG conversion efficiencies of more than 70% have been observed with LBO for pulsed Nd:YAG lasers and 30% conversion efficiencies have been observed with LBO for continuous wave (cw) Nd:YAG lasers. THG conversion efficiency of over 60% for pulse Nd:YAG lasers have been observed with LBO. LBO is also an excellent nonlinear optical (NLO) crystal for an optical parametric oscillator (OPO) or optical parametric amplifier (OPA) with a widely tunable wavelength range and high output power. Thus, LBO is a desirable non-linear optical crystal for many applications.

However, LBO is a difficult material to work with. LBO is hygroscopic and expensive. In an optical system, the LBO crystal needs to be clean, stable, e.g., perfectly still. Typically one must control the temperature of the crystal to within 0.1° C. for critical phase matching. Noncritical phase matching has much looser temperature tolerance. In addition, the mounting of the crystal is critical due to the unusually anisotropic thermal expansion of LBO. In particular, LBO has coefficients of thermal expansion of $10.8 \times 10^{-5}$/K, $-8.8 \times 10^{-5}$/K, and $3.4 \times 10^{-5}$/K for its x, y and z crystal axes, respectively. Optical considerations determine the cut of the crystal, i.e., phase matching. For example, a second harmonic generation (SHG) cut for LBO is easier to implement than a third harmonic generation (THG) cut. Likewise, a mounting system for SHG is easier than for THG.

The properties of LBO make it particularly difficult to mount in an oven. In the past, laser systems have used glue or a clamping mechanism (e.g., spring loads) to secure an LBO crystal to the oven for SHG or THG. Other systems have used gold flash and solder to mount LBO crystals. To avoid damage to the crystal due to anisotropic thermal expansion, a small dot of glue may be used to mount the LBO (5-mm to 15-mm long) crystal to the oven. To reduce strain, the glue is then typically cured near room temperature. However, a single dot of glue may not be sufficient to hold the LBO crystal securely and stably while protecting the crystal from chipping or cracking. Another problem is that the thermally anisotropic LBO is usually glued to a thermally isotropic metal. A mismatch in coefficients of thermal expansion (CTE) between the LBO and the metal results in differences in thermal expansion that often break the LBO crystal. Furthermore, methods involving adhesives such as glue or solder and/or mechanical clamping have significant drawbacks such as crystal chipping and cracking, or mechanical instability.

There are many existing designs for laser based crystal holding. An example of a crystal holding apparatus for laser based systems is disclosed in U.S. Pat. No. 8,305,680, the entire contents of which are incorporated herein by reference. However, no particular design successfully meets all of the ideal requirements of such an assembly, including but not limited to: cleanliness, complexity, assembly/cycle time, and re-workability.

One problem regarding current designs is cleanliness, particularly with the presence of an affixing adhesive. For a variety of reasons, some designs use glue to fix the crystal in place rather than a mechanical holding approach (See FIG. 3A). The problem is that such adhesives have the potential to outgas or degrade when exposed to stray or scattered light. This outgassing/degradation contaminates the laser optics, potentially reducing the system lifetime. It is generally recognized that removing adhesives reduces the possibility of outgassing. Therefore, although adhesive works well for fixing the crystal, it is not ideal for the overall laser longevity.

Complexity is another category that defines a successful crystal enclosure design. Complex designs are disadvantaged by cost, BOM control, and packaging size. Despite engineering a small crystal enclosure, the various parts hold significant material and management costs. Generally an assembly containing fewer parts is lower in cost. FIG. 2C shows the inherent complexity of what is considered an industry accepted crystal enclosure (16 parts). Finally, due to the small size of these enclosures, designs with more parts tend to have lots of small parts that are very difficult for a trained technician to handle.

One of the most important areas associated with crystal enclosures is the assembly/cycle time. The assembly time is the actual amount of time that it takes a technician to build the assembly. The cycle time is the assembly time plus whatever additional time passes until the assembly is ready to be put into production. For example, one downside to the glued design (shown in FIG. 3A) is the cycle time. While the actual assembly time is less than 30 minutes, there is at least 18 hours of cycle time consisting of waiting for the glue to cure before the assembly can be used. Conversely, a complex assembly (e.g., as in FIGS. 2A-2C) requires a tremendous amount of assembly time (30-60 minutes). Although there is additional cycle time involved (like the glue design), the amount of assembly time required is substantial. Finally, extended assembly and cycle times come with significant risk of damage to the sensitive optical crystals.

Another issue facing a successful design is the ability for re-work. One major disadvantage of the glue design is that it cannot be re-worked once assembled. This means that the crystal as well as the aluminum base piece cannot be recovered if repair is required. For a complex design such as the industry accepted standard (e.g., FIGS. 2A-2C), there is danger in re-working such an assembly within the laser head. It is very easy to drop these small parts, requiring the entire assembly to be removed from the laser just for crystal replacement. This is a tedious process, which adds a tremendous amount of time and effort which could be avoided if an ideal enclosure design was used instead.

It is within this context that embodiments of the present invention arise.

BRIEF DESCRIPTION OF THE DRAWINGS

FIG. 2A is a three-dimensional view of the industry accepted standard crystal enclosure illustrating the mounting of a crystal utilizing a mechanical holding approach.

FIG. 2B is a view of the crystal mount of FIG. 2A with the overlapping parts made transparent.

FIG. 2C is an exploded view of the crystal mount of FIG. 2A.

FIG. 3A is a three-dimensional view of the industry accepted standard crystal enclosure illustrating the mounting of a crystal utilizing an adhesive holding approach.

FIG. 3B is an exploded view of the crystal mount of FIG. 3A.

DETAILED DESCRIPTION

Figure 1:
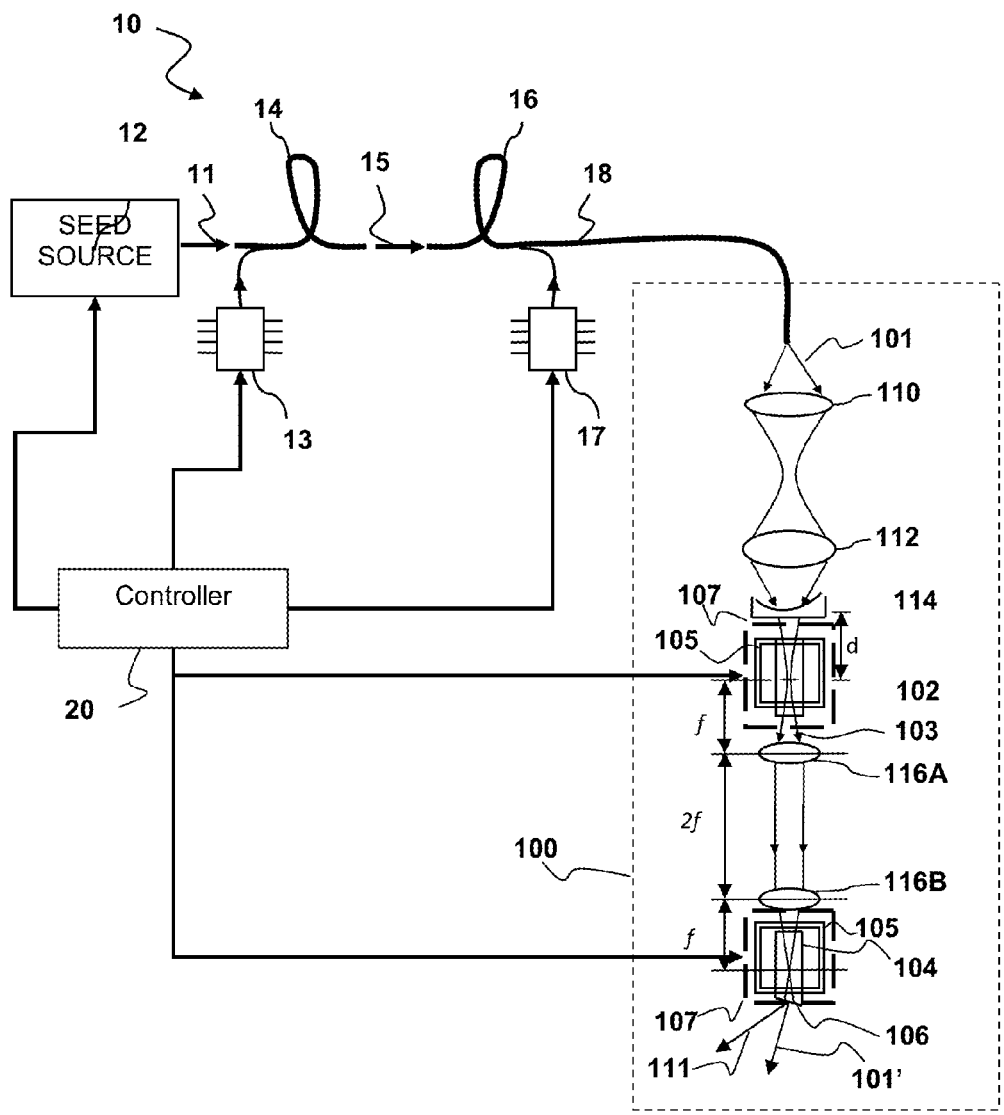
FIG. 1 is a schematic diagram of a wavelength converted laser system.

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

GLOSSARY

As used herein, the following terms have the following meanings:

Beam splitter refers to an optical device capable of splitting a beam of light into two or more parts.

Cavity or Optically Resonant Cavity refers to an optical path defined by two or more reflecting surfaces along which light can reciprocate or circulate. Objects that intersect the optical path are said to be within the cavity.

Continuous wave (CW) laser refers to a laser that emits radiation continuously rather than in short bursts, as in a pulsed laser.

Diode Laser refers to a light-emitting diode designed to use stimulated emission to generate a coherent light output. Diode lasers are also known as laser diodes or semiconductor lasers.

Diode-Pumped Laser refers to a laser having a gain medium that is pumped by a diode laser.

Gain refers to an increase in intensity, power, or pulse energy of a signal that is transmitted from one point to another through an amplifier. The term "unsaturated gain" refers to the increase of a small signal passing through the amplifier, which does not significantly change the inversion level in the amplifier. As used herein gain and unsaturated gain will be used interchangeably.

Gain Medium refers to a material capable of generating optical gain as described below with respect to a Laser.

Garnet refers to a particular class of oxide crystals, including e.g., yttrium aluminum garnet (YAG), gadolinium gallium garnet (GGG), gadolinium scandium gallium garnet (GSGG), yttrium scandium gallium garnet (YSGG) and similar.

Infrared Radiation refers to electromagnetic radiation characterized by a vacuum wavelength between about 700 nanometers (nm) and about 100,000 nm.

Laser is an acronym of light amplification by stimulated emission of radiation. A laser is a cavity that is contains a lasable material. This is any material—crystal, glass, liquid, semiconductor, dye or gas—the atoms of which are capable of being excited to a metastable state by pumping e.g., by light or an electric discharge. Light is emitted from the metastable state by the material as it drops back to the ground state. The light emission is stimulated by the presence by a passing photon, which causes the emitted photon to have the same phase and direction as the stimulating photon. The light (referred to herein as stimulated radiation) oscillates within the cavity, with a fraction ejected from the cavity to form an output beam.

Lateral Direction: As used herein, the term "lateral" or "transverse" describes the axis perpendicular to the axis upon which the biasing tensioning region and rounded bend regions of the spring clip, disclosed herein, travels. The lateral direction is perpendicular to the direction upon which the optical crystal is mounted and the direction in which light travels through the optical crystal.

Light: As used herein, the term "light" generally refers to electromagnetic radiation in a range of frequencies running from infrared through the ultraviolet, roughly corresponding to a range of vacuum wavelengths from about 1 nanometer (10-9 meters) to about 100 microns.

Longitudinal direction: As used herein, the term "longitudinal" describes the axis upon which the biasing tensioning region and rounded bend regions of the spring clip, disclosed herein, travels; the longitudinal direction is perpendicular to the lateral/traverse direction. The longitudinal direction is parallel to the direction upon which the optical crystal is mounted and the direction in which light travels through the optical crystal.

Non-linear effect refers to a class of optical phenomena that can typically be viewed only with nearly monochromatic, directional beams of light, such as those produced by a laser. Higher harmonic generation (e.g., second-, third-, and fourth-harmonic generation), optical parametric oscillation, sum-frequency generation, difference-frequency generation, optical parametric amplification, and the stimulated Raman Effect are examples of non-linear effects.

Nonlinear Optical Wavelength Conversion Processes are non-linear optical processes whereby input light of a given vacuum wavelength $\lambda 0$ passing through a non-linear medium interacts with the medium and/or other light passing through the medium in a way that produces output light having a different vacuum wavelength than the input light. Nonlinear wavelength conversion is equivalent to nonlinear frequency conversion, since the two values are related by the vacuum speed of light. Both terms may be used interchangeably. Nonlinear Optical Wavelength conversion includes:

Higher Harmonic Generation (HHG), e.g., second harmonic generation (SHG), third harmonic generation (THG), fourth harmonic generation (FHG), etc., wherein two or more photons of input light interact in a way that produces an output light photon having a frequency MO, where N is the number of photons that interact. For example, in SHG, N=2.

Sum Frequency Generation (SFG), wherein an input light photon of frequency f1 interacts with another input light photon of frequency f2 in a way that produces an output light photon having a frequency f1+f2.

Difference Frequency Generation (DFG), wherein an input light photon of frequency f1 interacts with another input light photon of frequency f2 in a way that produces an output light photon having a frequency f1-f2.

Examples of non-linear crystals include, but are not limited to, lithium niobate (LiNbO3), lithium triborate (LBO), beta-barium borate (BBO), cesium lithium borate (CLBO), lithium tantalite, stoichiometric lithium tantalite (SLT) potassium titanyl phosphate (KTiOPO4 also known as KTP), ammonium dihydrogen arsenate (ADA), ammonium dihydrogen phosphate (ADP), cesium triborate (CsB3O5 or CBO), deuterated ammonium dihydrogen arsenate (DADA), deuterated ammonium dihydrogen phosphate (DADP), deuterated arginine phosphate (DLAP), rubidium di-deuterium phosphate (RbD2PO¬ 4 or DRDP, potassium aluminum borate (KABO), potassium dihydrogen arsenate (KDA), potassium dihydrogen phosphate (KDP), deuterated potassium dihydrogen phosphate (KD2PO4 or DKDP), Li2B4O7 (LB4), or lithium formate monohydrate (LFM) and isomorphs thereof, periodically poled materials such as periodically poled lithium niobate (PPLN), periodically poled lithium tantalite and periodically poled stoichiometric lithium tantalite (PPSLT), and the like. Optical fiber can also be induced to have a non-linear response to optical radiation by fabricating microstructures in the fiber.

Optical amplifier refers to an apparatus that amplifies the power of an input optical signal. An optical amplifier is similar to a laser in that it uses a gain medium driven by pumping radiation. The amplifier generally lacks feedback (i.e. a cavity), so that it has gain but does not oscillate. As used herein an optical power amplifier generally refers to the last optical amplifier before delivery of an amplified beam to a target or a wavelength converter. An amplifier stage between a source of radiation and a power amplifier is generally referred to herein as a preamplifier.

Phase-matching refers to the technique used in a multiwave nonlinear optical process to enhance the distance over which the coherent transfer of energy between the waves is possible. For example, a three-wave process is said to be phase-matched when $k_1+k_2=k_3$, where $k_1$ is the wave vector of the $i^{th}$ wave participating in the process. In frequency doubling, e.g., the process is most efficient when the fundamental and the second harmonic phase velocities are matched. Typically the phase-matching condition is achieved by careful selection of the optical wavelength, polarization state, and propagation direction in the non-linear material.

Pulse Energy refers to the amount of energy in a pulse. Pulse energy may be calculated by integrating instantaneous pulse power over the pulse period.

Pulse Period (T) refers to the time between equivalent points of successive pulses in a train of two or more pulses.

Pulse Repetition Frequency (PRF) refers to the rate of repetition of pulses per unit time. The PRF is inversely related to the period T, e.g., PRF=1/T.

Q refers to the figure of merit of a resonator (cavity), defined as $(2\pi)\times$(average energy stored in the resonator)/(energy dissipated per cycle). The higher the reflectivity of the surfaces of an optical resonator and the lower the absorption losses, the higher the Q and the less energy loss from the desired mode.

Q-switch refers to a device used to rapidly change the Q of an optical resonator.

Q-switched Laser refers to a laser that uses a Q-switch in the laser cavity to prevent lasing action until a high level of inversion (optical gain and energy storage) is achieved in the lasing medium. When the switch rapidly increases the Q of the cavity, e.g., with acousto-optic or electro-optic modulators or saturable absorbers, a giant pulse is generated.

Quasi-CW refers to generating a succession of pulses at a high enough repetition rate to appear continuous.

Quasi Phase-matched (QPM) Material: In a quasi-phase-matched material, the fundamental and higher harmonic radiation are phase-matched by periodically changing the sign of the material's non-linear coefficient. The period of the sign change (kQPM) adds an additional term to the phase matching equation such that kQPM+k1+k2=k3. In a QPM material, the fundamental and higher harmonic can have identical polarizations, often improving efficiency. Examples of quasi-phase-matched materials include periodically-poled lithium tantalate (PPLT), periodically-poled lithium niobate (PPLN), periodically poled stoichiometric lithium tantalate (PPSLT), periodically poled potassium titanyl phosphate (PPKTP) or periodically poled microstructured glass fiber.

Ultraviolet (UV) Radiation refers to electromagnetic radiation characterized by a vacuum wavelength shorter than that of the visible region, but longer than that of soft X-rays. Ultraviolet radiation may be subdivided into the following wavelength ranges: near UV, from about 380 nm to about 200 nm; far or vacuum UV (FUV or VUV), from about 200 nm to about 10 nm; and extreme UV (EUV or XUV), from about 1 nm to about 31 nm.

Vacuum Wavelength: The wavelength of electromagnetic radiation is generally a function of the medium in which the wave travels. The vacuum wavelength is the wavelength electromagnetic radiation of a given frequency would have if the radiation were propagating through a vacuum and is given by the speed of light in vacuum divided by the frequency.

Waist: As usual in Gaussian optics, the waist w of a beam refers to the radius of that beam at its smallest point; i.e., at the focus. The radius of a beam is defined as the distance between the center of the beam and the point where the intensity falls to 1/e2 of the value at the center. When the beam is not round, one generally speaks of two waists, or waist radii, $w_x$ and $w_y$, obtained by fitting the beam to an elliptical Gaussian and extracting the 1/e2 distances along the major and minor axes. The diameter, or width, of a beam along a certain direction (say, along the x-axis) is twice the value of the waist: diameter=2 w.

In this document, the terms "a" and "an" are used, as is common in patent documents, to include one or more than one. In this document, the term "or" is used to refer to a nonexclusive "or," such that "A or B" includes "A but not B," "B but not A," and "A and B," unless otherwise indicated. The following detailed description, therefore, is not to be taken in a limiting sense, and the scope of the present invention is defined by the appended claims.

Introduction

To illustrate the context of aspects of the present disclosure, FIG. 1 depicts an example of a wavelength-converted laser system 10. Specifically, the system 10 generally includes a seed source 12, one or more optical amplifiers 14, 16, and a wavelength converter 100. The seed source 12 generates seed radiation 11, which is amplified by the optical amplifiers 14, 16 to produce an amplified output that serves as input radiation 101 for the wavelength converter. The wavelength converter 100 wavelength converts at least a portion of the amplified output to produce a wavelength converted output 111. A portion 101' of the input 101 may also emerge from the wavelength converter 100.

The optical amplifiers may include one or more amplifier units 14, 16. For example, an optional pre-amplifier 14 can be optically coupled in series between the seed source 12 and a power amplifier 16. The pre-amplifier 14 may amplify the seed radiation 12 thereby producing an intermediate signal 15, which is amplified by the power amplifier 16 to produce the amplified output that forms the input beam 101. The amplifiers 14, 16 are optically coupled to an output fiber 18. The input beam 101 emerges from an end face of the fiber 18.

By way of example, one or more of the amplifiers 14, 16 may be fiber amplifiers that include optical fibers coupled to pumping sources 13, 17. The optical fibers may generally include a cladding and a doped core. The core of the fiber may be, e.g., about 6 microns in diameter. The fiber may be a polarization maintaining or single polarization fiber. A portion of one of the amplifiers 16 may form the output fiber 18. Input radiation that is to be amplified (e.g., seed radiation 11 or intermediate radiation 15) is coupled to the core. Pumping radiation from the pumping sources 13, 17 (e.g., diode lasers) is also typically coupled to the core, but may alternatively be coupled to the cladding. Dopant atoms, e.g., rare earth elements such as ytterbium (Yb), erbium (Er), neodymium (Nd), holmium (Ho) samarium (Sm) and thulium (Tm), or combinations of two or more of these, in the core of the fiber absorb energy from the pumping radiation. The absorbed energy amplifies the energy of the input radiation in the core of the fiber. The input radiation stimulates emission of radiation from the dopant atoms. The stimulated radiation has the same frequency and phase as the input radiation. The result is an amplified output having the same frequency and phase as the input radiation but a greater optical intensity.

A controller 20 may be operably coupled to the seed source 12 and/or pump sources 13, 17. The controller 20 may implement hardware or software logic adapted to control the power of the seed radiation 11 or pump radiation provided by the pump sources 13, 17. By controlling the power of the seed radiation 11 from the seed source and/or the pump radiation from the pump sources 13 and 17, the controller 20 controls the optical power of the input beam 101 provided to the wavelength converter 100.

The wavelength converter 100 may include first and second non-linear optical crystals 102, 104, relay lenses 110, 112 and a lens 114. In particular the first non-linear crystal 102 may be a SHG crystal that produces a SHG output 103 from a non-linear interaction between the crystal and the input radiation 101. The lens 114 may be placed a distance d from the SHG crystal 102. The lens 114 may be configured to image a circular input beam 101 to an elliptical beam waist within the SHG crystal 102 to at least partially compensate for walk-off due to anisotropy in the refractive index of the SHG crystal. Spherical lenses 116A, 116B may be configured to couple the SHG output 103 to a THG crystal 104 along with an unconverted portion of the input radiation 101. The THG crystal produces third harmonic radiation through a sum-frequency interaction between the SHG output 103 and the unconverted input radiation. The third harmonic radiation emerges from the THG crystal as the wavelength converted output 111. Some leftover input radiation 101' may also emerge from the THG crystal 104. The THG crystal may include a Brewster-cut end face 106 that separates the wavelength converted output 111 from the leftover input radiation 101'. By appropriately adjusting the focal length and position of the lens 114 it is possible to produce a beam of wavelength-converted output 111 having a desired cross-sectional shape.

In accordance with aspects of the present disclosure, one or both of the first and second non-linear optical crystals 102, 104 are secured by an inventive spring clamp crystal mount 105. Each crystal 102, 104 may be secured in a separate crystal mount or both crystals may be secured in the same mount. Furthermore, although the system shown uses two nonlinear optical crystals, those skilled in the art will appreciate that aspects of the present disclosure may be adapted for use with a single nonlinear optical crystal or three or more nonlinear optical crystals. By way of example, and not by way of limitation one or more non-linear optical crystals 102, 104 may be a critically phase-matched Lithium Triborate (LBO) crystal. Alternative crystals include Lithium Niobate ($LiNBO_3$), and beta Barium Borate (BBO), among others. In a temperature critical system such as this, substantial swings or gradients in temperature are not acceptable. To achieve critical phase matching it is desirable to maintain the crystal at an optimized temperature. To optimize nonlinear optical conversion efficiency in LBO, for example, the temperature range desired is between 5-45° C., with a required accuracy of +/−0.1 C. Temperature control may be obtained by enclosing each crystal in a temperature controlled enclosure 107, e.g., an oven (or separate ovens). Separate enclosures may be used to allow for independent temperature control of separate crystals. The thermal enclosure may be made of sheet metal, e.g., aluminum, and may include heater elements, cooling elements (e.g., Peltier cooling elements) and temperature sensors (e.g., thermocouples). These components may be coupled to the controller 20 in a feedback loop.

According to aspects of the present disclosure, the crystal mount 105 is of a spring clip design that is shown in detail in FIG. 4A-FIG. 7 and described below. The disclosed design not only holds the crystal into a corner for locating purposes, but it also utilizes a face contact between the spring clip 301 and the crystal 205 to provide a path for conducting heat to or from the crystal. To appreciate the advantages of the spring clip design of the crystal mount shown in FIG. 4-FIG. 7, it is useful to understand the disadvantages of previous designs.

FIG. 2A is a three-dimensional view of the industry accepted standard crystal enclosure illustrating the mounting of a crystal utilizing a mechanical holding approach.

FIGS. 2B-2C are a view of the crystal mount of FIG. 2A with the overlapping parts made transparent, and an exploded view of the crystal mount of FIG. 2A, respectively. These figures relate the generally complexity of the industry accepted standard, as crystal enclosure is built using 16 distinct pieces, and can take anywhere from 30-60 minutes to assemble.

FIG. 3A is a three-dimensional view of the industry accepted standard crystal enclosure illustrating the mounting of a crystal utilizing an adhesive holding approach. FIG. 3B is an exploded view of the crystal mount of FIG. 3A. These figures serve to illustrate that the prior art describing adhesive holding methods require up to 18 hours of "cycle time" (assembly time plus whatever additional time passes until the assembly is ready to be put into production). While the apparatus in FIGS. 3A-3B requires less assembly time than the mechanical holding approach shown in FIGS. 2A-2C, e.g., less than about 30 minutes for the adhesive holding apparatus as opposed to 30-60 minutes for the mechanical holding approach, the adhesive holding approach requires up to 18 hours of a cycle time consisting of waiting for the glue to cure before the assembly can be used. Additionally, as noted herein, extended assembly and cycle times such as those used in the production of the current industry accepted standards come with significant risk of damage to the sensitive optical crystals.

Spring Clip Crystal Mount

Figure 4A:
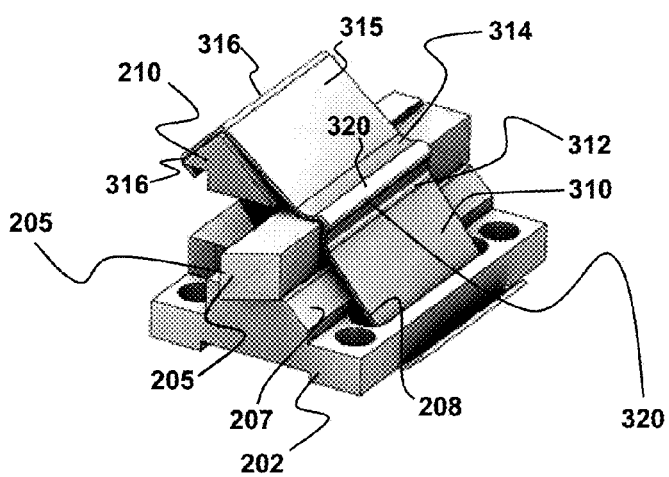
FIGS. 4A-4B depict a crystal mounting apparatus according to an aspect of the present disclosure.
Figure 4B:
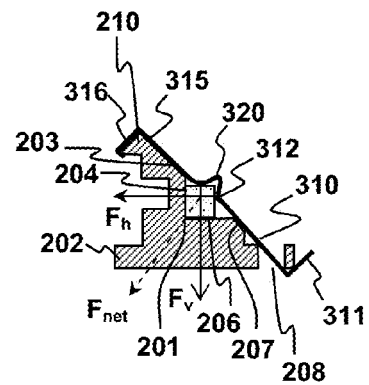

FIGS. 4A-4B depict a crystal mounting apparatus 200 according to an aspect of the present disclosure. The apparatus generally includes a base piece 202 extending in the longitudinal direction with first and second longitudinally-extending walls 204, 206 that are angled relative to each other forming a corner 201, as well as a single resilient biasing spring clip 301 to secure an optical crystal 205 to the base piece. According to some aspects of this disclosure, the crystal 205 may be regarded as a workpiece that is retained by the combination of the base piece 202 and the spring clip 301. According to other aspects of the disclosure, a combination in which the crystal 205 is retained by the base piece 202 and the spring clip 301 may be regarded as a sub-assembly of larger apparatus, such as the system 100 of FIG. 1.

In the illustrated example, the longitudinally extending crystal 205, includes four faces that extend in the longitudinal direction. A first face of the four faces is perpendicular to a second face of the four faces. A third face of the four faces is perpendicular to a fourth face of the four faces. The first face is parallel to the third face, and the second face is parallel to the fourth face. By way of example, and not by way of limitation, the crystal 205 may be a single crystal of Lithium Borate (LBO) having cross-sectional dimensions of 2.5 mm×2.5 mm and a longitudinal dimension of 15 mm. As noted above, other crystal materials and geometries may be used.

The body 202 includes a diagonal face having a first section 203 between the second wall 206 and a slot 208 and a second section 207 between a peak of an angled lip 210 and the first wall 204. In the example shown in FIGS. 4A-4B the diagonal face is at an angle of 45° with respect to the first wall 204 and second wall 206. The body 202 may be made of a suitably durable material that is compatible with operation of the crystal 205 at elevated temperatures. Examples of suitable materials include 6061 T6 aluminum. Alternatives include copper, stainless, silicon carbide, titanium, molybdenum, tungsten, tantalum, Invar, Kovar, ceramics, aluminum nitride, other thermally conductive moderately stiff materials, diamond. The material of the body 202 may be plated (e.g., w/Ni, Au, Cu) or unplated.

Figure 5A:
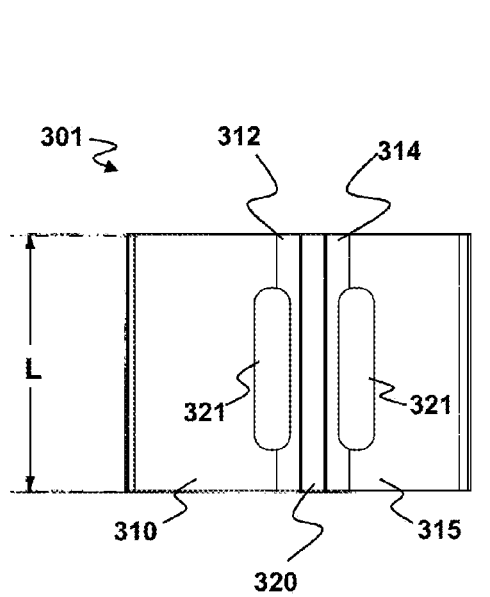
FIG. 5A depicts a top-down view of an alternative spring clip in accordance with an aspect of the present disclosure.
Figure 5B:
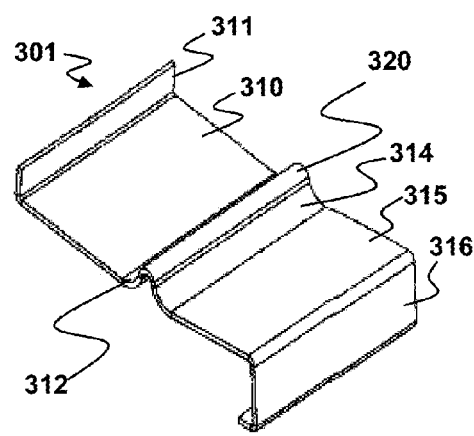
FIG. 5B depicts three-dimensional view of the spring clip used in the crystal mounting apparatus of FIGS. 4A-4B.

FIGS. 5A-5B show additional details of the spring clip 301. The spring clip 301 is made of a resilient material that is compatible with operation of the crystal at elevated temperatures. Examples of suitable materials include stainless steel, e.g., a 300 series stainless steel such as 304 stainless. Alternative materials include, but are not limited to, other metals, such as Beryllium-Copper (BeCu), sufficiently resilient polymers, e.g., polypropylene, ULTEM, Delrin, polycarbonate, ABS. Other materials include fiberglass, carbon fiber, composite materials, graphene, and the like. The spring clip has an overall length L in the longitudinal direction. In one non-limiting example, a spring clip was made from a sheet of 304 stainless 0.010 inches (0.254 mm) thick. In that example, the overall length L was 10 mm. The length L may be less than the overall length of the crystal. In some applications, it may be desirable for the overall length L to be equal to or greater than the length of the crystal 205. Also, in some implementations, the spring clip 301 may include openings 321 that permit viewing of portions of the crystal 205 when the clip secures the crystal to the body 202. Such openings are particularly useful for viewing the seating and centering of the crystal 205. In other implementations thicker material may be used to increase thermal conductivity along the spring clip 301.

The spring clip 301 includes rounded first bend region 312 of that is tensioned against the first face of the crystal to press the third face of the crystal in contact with the first wall 204 of the corner 201 of the base piece 202. A rounded second bend region 314 of the spring clip is tensioned against the second face of the crystal to press the fourth face of the crystal in contact with the second wall 206 of corner 201. The first and second bend regions are joined by a biasing region 320 having a curvature that is opposite to that of the first and second bend regions. In the example depicted in FIGS. 4A-4C, the first bend region 312 exerts a horizontal force $F_h$ that urges the crystal 205 against a vertical first wall 204 while the second bend region exerts a vertical force $F_v$ that urges the crystal 205 against a horizontal second wall 206. The net force $F_{net}$ exerted on the crystal 205 by the bend regions 312, 314 is directed diagonally toward the corner 201 of the base piece 202.

To tension the first and second bend regions, the spring clip 301 may include a first leaf section 310 that extends from the first bend region 312 and terminates in a first hooked portion 311 and a second leaf section 315 that extends from the second bend region 314 and terminates in a second hooked portion 316. The first leaf section 310 and hooked portion 311 form an "L" shape that fits into a slot in the base portion. The second leaf section 315 and hooked portion 316 form a "J" shape that fits over an angled lip 210 of the base portion 202.

To secure the crystal 205 to the body portion 202, the crystal is placed lengthwise with a corner between two faces at the corner between the first and second walls of the base piece. The first hooked portion 311 is inserted in the slot 208 and the second hooked portion 316 is hooked over angled lip 212. Tension in the spring clip presses the first and second bend regions 312,314 against the first and second faces of the crystal 205, thereby urging the crystal toward the corner 201. The first leaf 310 presses against the first diagonal face 203 of the body 202 and the second leaf 315 presses against the second diagonal face section 207. To remove the spring clip 301, the second hooked portion 316 is unhooked from the angled lip 212, e.g., by prying it loose with a flat head screwdriver or similar tool. Although only single spring is shown, those skilled in the art will recognize that the apparatus 200 may be modified to include two or more spring clips to secure a longer crystal. Similarly, two or more crystals may be secured to the same body with one or more spring clips. By way of example and not by way of limitation multiple crystals may be secured in tandem using one or more body and spring clip assemblies of the type described herein. Such an arrangement could be used, e.g., for non-critical phase matching at temperatures up to about 300° C.

Figure 6:
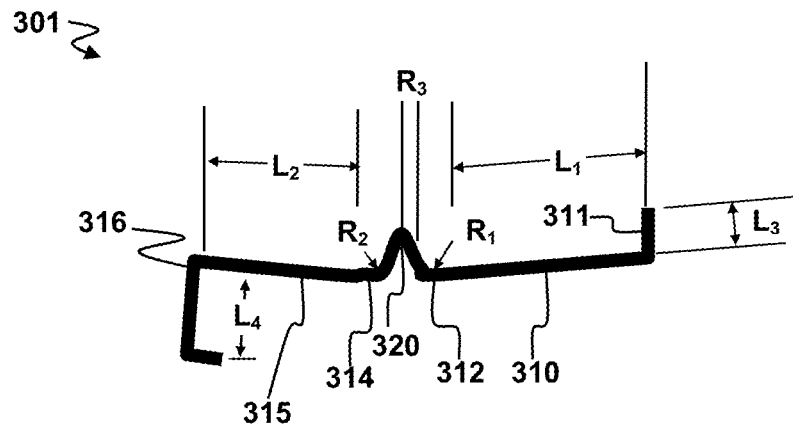
FIG. 6 is a lateral view of the resilient spring clip according to aspects of the present disclosure.
Figure 7:
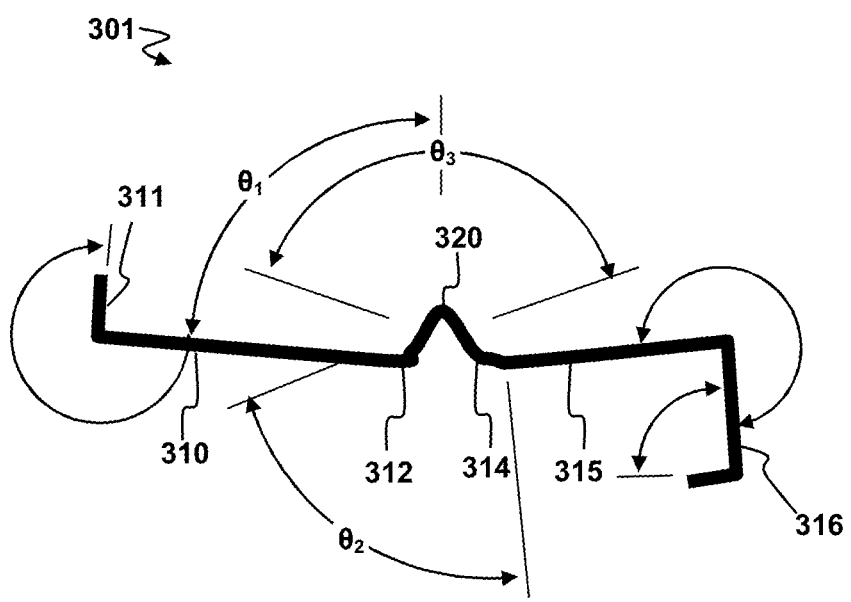
FIG. 7 is a reverse lateral view of the resilient spring clip.

To optimize the operation of the spring clip, it is useful to understand the importance of certain dimensions thereof. FIG. 6 depicts a lateral view of the resilient spring clip 210. Key dimensions depicted in FIG. 6 include the radius of curvature $R_1$ of the first bend region 312, the radius of curvature $R_2$ of the second bend region 314 and the radius of curvature $R_3$ of the biasing region 320. The tension in the spring clip due to bending forces exerted by each bend region, though mainly the first bend region 312 and the second bend region 314. The tension in the spring clip generally decreases as the corresponding radius of curvature increases. Other important dimensions include the length $L_1$ of the first leaf section 310 and the length $L_2$ of the second. The lengths $L_1$, $L_2$ also critically affect the forces exerted by the spring on the crystal 205. Generally longer lengths $L_1$, $L_2$ tend to decrease the force on the crystal. This is a function of a cantilevered beam 'spring equivalent' (i.e., a fixed displacement Y in the vertical direction on a beam will result in a lesser force as the beam length increase and vice versa). For this particular design, the lengths $L_1$, $L_2$, the radii $R_1$, $R_2$, and the angle $\theta_1$ have the most control over the resulting force on the crystal. The thickness of the material of the spring clip is also a major factor in determining the resulting force on the crystal. Also, a length $L_3$ of the first hooked portion 311 may be designed so that this hooked portion fits properly in the slot 208 and a length $L_4$ of the second hooked portion 316 may be designed so that this hooked portion fits properly over the angled lip 210. As shown in FIG. 7 other critical dimensions include the bend angles $\theta_1$, $\theta_1$, and $\theta_3$ of the first bend region 312, second bend region 314, and biasing region 320, respectively. These may be selected so that the first and second leaf portions 310,315 are at a slight angle relative to one another.

In addition to the above critical functional requirements, the disclosed design has significant assembly and cycle time improvements. Compared to the industry standard (FIGS. 2A-2C, 30 minutes assembly, 0 cycle) and a glued version (FIGS. 3A-3B, 30 minutes assembly, 20 hours cycle), the disclosed design requires less than 1 minute of assembly time. This is a <5% of the total assembly/cycle time versus the other designs!

The disclosed design is also exceptionally re-workable, taking less than 1 minute to remove the spring clip. There are no small parts to lose and no screw (friction) parts producing particles during the rework operation.

Finally, the disclosed design only utilizes 2 parts and they are cheaper than the glue design (FIGS. 3A-3B). The spring clip is designed for mass manufactured production, enabling further cost reductions.

There are a number of possible variations on the implementations described above. For example, although the examples described herein assume a crystal having a square cross-section, aspects of the present disclosure include implementations in which this is not the case. The design of the body 202 and spring clip 301 may be modified for different crystal cross-sections, e.g., non-square rectangular cross-sections. For example, the curved regions 312, 314 would have different radii of curvature in order to get the net force exerted on the crystal to urge the crystal toward the corner 201. Force gauges may be placed on the sides of the crystal during testing of the design of the spring clip 301 to determine the force exerted on the crystal by the clip. The bends in the curved regions of the spring claim may also be adjusted increase the area of contact between the bend regions and the crystal.

Although the illustrated examples depict use of a single clip that exerts forces on two different crystal faces to push the crystal into a corner of a receptacle, aspects of the present disclosure are not limited to such implementations. In alternative implementations the functions of the described single clip may be implemented by two separate clips, where each clip pushes on a different surface of the crystal to produce a net force that urges the crystal into the corner.

Furthermore, although the above examples illustrate an apparatus for securing a crystal with a square or rectangular cross-section, aspects of the present disclosure are not limited to such implementations. In alternative implements, a cylindrical crystal that may be mounted in a corner or v-groove in a receptacle and rotated to the correct polarization. In the case of a cylindrical crystal, a single bend leaf-spring could secure the crystal to the v-groove or corner. In other alternative implementations, a multi-faceted crystal may have some exposed faces that are orthogonal to the crystalline axis and a suitably configured spring clip may exert forces on two or more such faces to produce forces that urge the crystal into a corner or v-groove.

While the above is a complete description of the preferred embodiment of the present invention, it is possible to use various alternatives, modifications and equivalents. Therefore, the scope of the present invention should be determined with reference to the appended claims, along with their full scope of equivalents. Any feature, whether preferred or not, may be combined with any other feature, whether preferred or not. The appended claims are not to be interpreted as including means-plus-function limitations, unless such a limitation is explicitly recited in a given claim using the phrase "means for." Any element in a claim that does not explicitly state "means for" performing a specified function, is not to be interpreted as a "means" or "step" clause as specified in 35 USC §112(f). In particular, the use of "step of" in the claims herein is not intended to invoke the provisions of 35 USC §112(f).

What is claimed is:
1. An apparatus, comprising:
 a) a body comprising:
  a receptacle for receiving a crystal, the receptacle extending in the longitudinal direction, the receptacle comprising a first wall extending in the longitudinal direction and a second wall extending in the longitudinal direction, the first wall and the second wall being substantially perpendicular to one another to form a corner region extending in the longitudinal direction;

b) one or more spring clips securable to the body configured to exert forces on two different faces of a crystal to push the crystal into a corner of the receptacle, wherein the one or more spring clips include a spring clip having a rounded first bend region extending in the longitudinal direction;

a rounded second bend region extending in the longitudinal direction;

a biasing region connecting the first bend region to the second bend region a first leaf region connected to the rounded first bend region, the first leaf region extending laterally away from the rounded first bend region;

a second leaf region connected to the rounded second bend region, the second leaf region extending laterally away from the rounded second bend region.

2. The apparatus of claim 1,
wherein a first leaf region terminates in a first hooked portion configured to be received in a slot in the body.

3. The apparatus of claim 2, wherein the second leaf region terminates in a second hooked portion configured to be secured over a lip portion of the body.

4. The apparatus of claim 3, wherein the receptacle is disposed between the lip portion and the slot.

5. The apparatus of claim 1, further comprising a longitudinally extending crystal disposed in the receptacle.

6. The apparatus of claim 5,
wherein the longitudinally extending crystal includes four faces, each of the four faces extending in the longitudinal direction, a first face of the four faces being perpendicular to a second face of the four faces, a third face of the four faces being perpendicular to a fourth face of the four faces, the first face being parallel to the third face, and the second face being parallel to the fourth face;

the rounded first bend region of the spring clip being tensioned against the first face of the crystal to press the third face of the crystal in contact with the first wall;

the rounded second bend region of the spring clip being tensioned against the second face of the crystal to press the fourth face of the crystal in contact with the second wall.

7. The apparatus of claim 6, wherein
the rounded first bend region is tensioned against the first face of the crystal in a direction substantially orthogonal to the first wall; and
wherein the rounded second bend region being tensioned against the second face of the crystal in a direction substantially orthogonal to the second wall.

8. The apparatus of claim 6,
wherein the longitudinally extending crystal having a rectangular cross section in a transverse plane that is transverse to the longitudinal direction.

9. The apparatus of claim 1, wherein the one or more spring clips include two or more spring clips.

10. The apparatus of claim 1, wherein the one or more spring clips include a single spring clip.

11. The apparatus of claim 10, wherein the single spring clip is configured to secure the crystal to the body by exerting nearly equal forces on the crystal in orthogonal directions to urge the crystal toward the corner region.

12. A wavelength-converted laser system comprising:
a laser system configured to emit a laser beam;
optics configured to couple the laser beam to at least one non-linear optical crystal of a set of one or more non-linear optical crystals; and an apparatus for retaining the at least one optical crystal, the apparatus comprising:

a) a body having a receptacle for receiving a crystal, the receptacle extending in the longitudinal direction, the receptacle comprising a first wall extending in the longitudinal direction and a second wall extending in the longitudinal direction, the first wall and the second wall being substantially perpendicular to one another to form a corner region extending in the longitudinal direction; and b) one or more spring clips securable to the body configured to exert forces on two different faces of the at least one non-linear optical crystal to push the at least one non-linear optical crystal into a corner of the receptacle, the one or more spring clips include a spring clip having a rounded first bend region extending in the longitudinal direction; a rounded second bend region extending in the longitudinal direction; and a biasing region connecting the first bend region to the second bend region, wherein the spring clip is secured to the body and the spring clip secures the at least one non-linear optical crystal in the receptacle;

a first leaf region connected to the rounded first bend region, the first leaf region extending laterally away from the rounded first bend region;

a second leaf region connected to the rounded second bend region, the second leaf region extending laterally away from the rounded second bend region.

13. The system of claim 12,
wherein a first leaf region terminates in a first hooked portion configured to be received in a slot in the body.

14. The system of claim 13, wherein the second leaf region terminates in a second hooked portion configured to be secured over a lip portion of the body.

15. The system of claim 14, wherein the receptacle is disposed between the lip portion and the slot.

16. The system of claim 12, further comprising the at least one non-linear optical crystal.

17. The system of claim 16, wherein the at least one non-linear optical crystal comprises four faces, each of the four faces extending in the longitudinal direction, a first face of the four faces being perpendicular to a second face of the four faces, a third face of the four faces being perpendicular to a fourth face of the four faces, the first face being parallel to the third face, and the second face being parallel to the fourth face;

wherein the first bend region of the spring clip is tensioned against the first face of the at least one non-linear optical crystal to press the third face of the crystal in contact with the first wall;

wherein the second bend region of the spring clip is tensioned against the second face of the at least one non-linear optical crystal to press the fourth face of the crystal in contact with the second wall.

18. The system of claim 17,
wherein the rounded first bend region is tensioned against the first face of the at least one non-linear optical crystal in a direction substantially orthogonal to the first wall;
wherein the rounded second bend region is tensioned against the second face of the at least one non-linear optical crystal in a direction substantially orthogonal to the second wall.

19. The system of claim 16, wherein the at least one non-linear optical crystal has a rectangular cross section in a transverse plane that is transverse to the longitudinal direction.

20. The system of claim 12, wherein the one or more spring clips include two or more spring clips.

21. The system of claim 12, wherein the one or more spring clips include a single spring clip securable to the body.

22. The system of claim 21, wherein the single spring clip is configured to secure the crystal to the body by exerting nearly equal forces on the crystal in orthogonal directions to urge the crystal toward the corner region.

23. The system of claim 12 wherein the laser system includes a seed source and a fiber amplifier optically coupled to the seed source.

* * * * *